(12) United States Patent  
Shi

(10) Patent No.: US 10,361,399 B2  
(45) Date of Patent: Jul. 23, 2019

(54) TOP-EMITTING OLED AND A MANUFACTURING METHOD THEREOF

(71) Applicant: Shenzhen China Star Optoelectronics Technology Co., Ltd., Shenzhen, Guangdong (CN)

(72) Inventor: Ting Shi, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 59 days.

(21) Appl. No.: 15/543,989

(22) PCT Filed: Jun. 16, 2017

(86) PCT No.: PCT/CN2017/088624  
§ 371 (c)(1),  
(2) Date: Jul. 15, 2017

(87) PCT Pub. No.: WO2018/201568  
PCT Pub. Date: Nov. 8, 2018

(65) Prior Publication Data  
US 2018/0331323 A1    Nov. 15, 2018

(51) Int. Cl.  
  *H01L 29/08* (2006.01)  
  *H01L 51/52* (2006.01)  
  *H01L 51/56* (2006.01)  
  *H01L 21/02* (2006.01)  
  *H01L 51/50* (2006.01)

(52) U.S. Cl.  
  CPC .... *H01L 51/5268* (2013.01); *H01L 21/02601* (2013.01); *H01L 51/5056* (2013.01); *H01L 51/5072* (2013.01); *H01L 51/5271* (2013.01); *H01L 51/56* (2013.01); *H01L 51/5203* (2013.01); *H01L 2251/5315* (2013.01); *H01L 2251/5369* (2013.01)

(58) Field of Classification Search  
  CPC . H01L 51/56; H01L 51/5271; H01L 51/5072; H01L 51/5056; H01L 51/5268; H01L 51/5203; H01L 21/02601  
  See application file for complete search history.

(56) References Cited

U.S. PATENT DOCUMENTS

| 7,902,748 | B2 * | 3/2011 | Cok | ............... B82Y 20/00 |
| | | | | 313/506 |
| 8,890,395 | B2 | 11/2014 | Zijp | |
| 9,343,704 | B2 | 5/2016 | Setz | |
| 2015/0021558 | A1 * | 1/2015 | Lee | ............... H01L 51/5076 |
| | | | | 257/40 |

FOREIGN PATENT DOCUMENTS

| CN | 102299266 A | 12/2011 |
| CN | 103682163 A | 3/2014 |
| CN | 104425724 A | 3/2015 |

* cited by examiner

*Primary Examiner* — Alonzo Chambliss  
(74) *Attorney, Agent, or Firm* — Andrew C. Cheng

(57) ABSTRACT

The present invention provides a Top-Emitting Organic Light Emitting Diode (TEOLED) and a manufacturing method thereof. The TEOLED includes a substrate; a stack structure on the substrate; a cathode layer covering the stack structure; and a light-scattering layer composed of nano particles and including a concave and convex structure. The present invention can effectively improve cathode transmittance of the TEOLED and modulate the coupling output of lights with multiple wavelengths.

14 Claims, 2 Drawing Sheets

TOP-EMITTING OLED AND A MANUFACTURING METHOD THEREOF

BACKGROUND

Technical Field

The present invention relates to display field, and more particularly, to a Top-Emitting Organic Light Emitting Diode (TEOLED) and a manufacturing method thereof.

Description of Related Art

Organic Light Emitting Diode (OLED) has advantage such as high brightness, self-luminous, rapid response, and low forward voltage and has become new technology of display field. The type of the OLED device can be divided to two structures according to difference of emitting direction, top-emitting (TE) OLED and bottom-emitting (BE) OLED. Active-matrix organic light-emitting diode (AM-OLED) is one of research focus for future large size and high resolution organic display device. It requires that the OLDE device coordinates with Thin Film Transistor (TFT). BEOLED device can only emit light from the bottom and aperture ratio is low because of bottom driving circuit. With resolution increasing, aperture ratio can be lower so BEOLED device cannot meet requirement of future high resolution displaying.

SUMMARY

The present invention provides a Top-Emitting Organic Light Emitting Diode (TEOLED) and a manufacturing method thereof. It can effectively improve cathode transmittance of the TEOLED and modulate the coupling output of lights with multiple wavelengths.

For solving the problem above, the present invention adopts an embodiment that provides a TEOLED including a substrate; a stack structure on the substrate, including an anode layer, a hole-injecting layer, a hole-transmitting layer, an organic light-emitting layer, and an electron-transmitting layer deposited on the substrate in order; a cathode layer covering the stack structure; and a light-scattering layer composed of nano particles and including a concave and convex structure, wherein material of the nano particles is selected from a group consisting of ZnO, $TiO_2$, and $SnO_2$.

For solving the problem above, the present invention adopts another embodiment that provides a TEOLED including a substrate; a stack structure on the substrate; a cathode layer covering the stack structure; and a light-scattering layer composed of nano particles and including a concave and convex structure.

For solving the problem above, the present invention adopts another embodiment that provides a method of manufacturing a Top-Emitting Organic Light Emitting Diode (TEOLED) including forming a stack structure and a cathode layer on a substrate in order; preparing nano particles on the cathode layer to form a light-scattering layer including a concave and convex structure; and performing package to form the TEOLED.

The benefit of the present invention is that the nano particles of high refraction index are prepared on the cathode layer to form the scattering layer, distinguishing from the conventional art. It can effectively improve cathode transmittance of the TEOLED and modulate the coupling output of lights with multiple wavelengths.

BRIEF DESCRIPTION OF THE DRAWINGS

The accompanying drawings are included to provide easy understanding of the application, are incorporated herein and constitute a part of this specification. The drawings illustrate embodiments of the application and, together with the description, serve to illustrate the principles of the application.

DESCRIPTION OF THE PREFERRED EMBODIMENTS

To better and concisely explain the disclosure, the same name or the same reference number given or appeared in different paragraphs or figures along the specification should has the same or equivalent meanings while it is once defined anywhere of the disclosure. In the case of no conflict, the following embodiments and the features thereof can be combined with each other.

Figure 1:
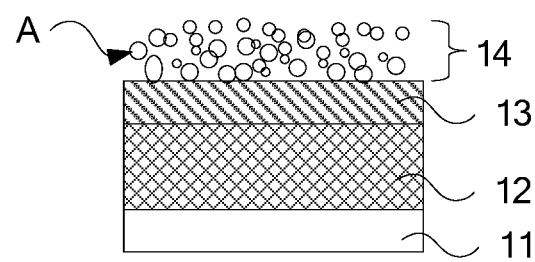
FIG. 1 is a schematic view of a TEOLED in accordance with an embodiment of the present invention.
Figure 2:
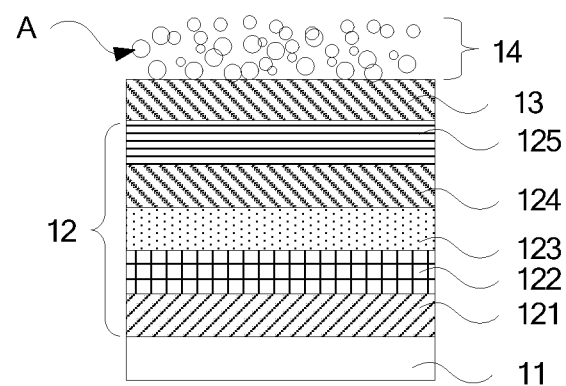
FIG. 2 is a schematic view of a TEOLED in accordance with another embodiment of the present invention.

Referring FIGS. 1-2, FIG. 1 is a schematic view of a Top-Emitting Organic Light Emitting Diode (TEOLED) in accordance with an embodiment of the present invention, and FIG. 2 is a schematic view of a TEOLED in accordance with another embodiment of the present invention. The TEOLED 10 includes a substrate 11, a stack structure 12, a cathode layer 13, and a light-scattering layer 14.

The substrate 11 can include transparent material. Specifically, it can be a substrate of any type such as glass, ceramic substrate, or transparent plastic. The present invention is not limited.

The stack structure 12 includes an anode layer 121, a hole-injecting layer 122, a hole-transmitting layer 123, an organic light-emitting layer 124, and an electron-transmitting layer 125 deposited on the substrate 11 in order. In an application of the present invention, the anode layer 121 of the stack structure 12 can select Ag. In another embodiment, it can also select ITO transparent conductive layer which is stable and transparent. Material of the hole-injecting layer 122 can be poly(3,4-ethylenedioxythiophene)/poly(styrenesulfonate) (PEDOT/PSS), and thickness thereof can be 30 nm. Material of the hole-transmitting layer 123 can be Poly (N ,N'-bis(4-butylphenyl)-N,N'-bis(phenyl)-benzidine) (Poly-TPD) and thickness thereof can be 20 nm. Material of the organic light-emitting layer 124 can be Poly(9,9-di-n-octylfluorenyl-2,7-diyl) (PFO), and thickness thereof can be 30 nm. Material of the electron-transmitting layer 125 can be 1,3,5-Tris(1-phenyl-1H-benzimidazol-2-yl)benzene (TPBi), and thickness thereof can be 30 nm.

In another embodiment, the anode layer 121, the hole-injecting layer 122, the hole-transmitting layer 123, the organic light-emitting layer 124, and the electron-transmitting layer 125 can also adopt other materials of different thickness. The present invention is not limited.

The cathode layer 13 covers the stack structure 12. In an application of the present invention, the cathode layer 13 can select Mg—Ag alloy as material for improving light-emitting efficiency of the element. In another embodiment, it can also adopt metal such as Ag, Al, Ca, In, Li, and Mg. The present invention is not limited.

The light-scattering layer 14 is deposited on the cathode layer 13, is composed of nano particles A, and includes a concave and convex structure.

The light-scattering layer 14 does not include matrix material such as photoresist. The light-scattering layer 14 is a dense thin film composed of nano particles A having high refraction index and high transparency, on the cathode layer 13. A surface of the thin film is an uneven scattering interface which composed of nano particles.

Material of the nano particles A can be one of ZnO, $SnO_2$, and $TiO_2$. Diameter of the nano particles A can be 50 nm~100 nm. In an embodiment, the diameter of the nano particles A can be the same or different. The nano particles A having different diameters can be distributed randomly, and coupling output of lights with multiple wavelengths can be controlled. Furthermore, refraction index of the nano particles A can be 2~3, and transparency thereof is larger than 95%. In an application of the present invention, the light-scattering layer 14 is made of ZnO of which refraction index is 2 and having high transparency. The ZnO particles forms the uneven scattering interface on the cathode layer 13 and can perform the coupling output of lights with multiple wavelengths.

In the embodiment above, nano particles of high refraction index are deposited on the cathode layer to form the scattering layer. It can effectively improve cathode transmittance of the TEOLED and modulate the coupling output of lights with multiple wavelengths.

Figure 3:
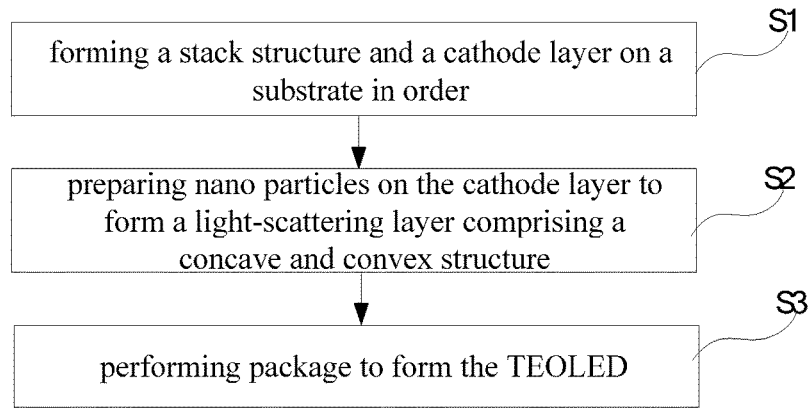
FIG. 3 is a flow chart of a method of manufacturing a TEOLED in accordance with an embodiment of the present invention.

Referring FIG. 3, FIG. 3 is a flow chart of a method of manufacturing a TEOLED in accordance with an embodiment of the present invention. The method includes steps blow:

S1, forming a stack structure and a cathode layer on a substrate in order.

The substrate can include transparent material. Specifically, it can be a substrate of any type such as glass, ceramic substrate, or transparent plastic. The present invention is not limited.

The stack structure further includes an anode layer, a hole-injecting layer, a hole-transmitting layer, an organic light-emitting layer, and an electron-transmitting layer. The anode layer, the hole-injecting layer, the hole-transmitting layer, the organic light-emitting layer, and the electron-transmitting layer are deposited in order. Selection of material and thickness for the stack structure is described above in detail. It is not iterated.

Furthermore, the cathode is deposited on the stack structure to improve light-emitting efficiency of the element. The cathode layer can select Mg-Ag alloy as material. In another embodiment, it can also adopt metal such as Ag, Al, Ca, In, Li, and Mg. The present invention is not limited.

S2, preparing a nano particle layer on the cathode layer to form a light-scattering layer having a concave and convex structure.

Material of the nano particles can select one of ZnO, $SnO_2$, and $TiO_2$. Diameter of the nano particles can be 50 nm~100 nm. In an embodiment, the diameter of the nano particles can be the same or different. The nano particles having different diameters can be distributed randomly, and coupling output of lights with multiple wavelengths can be controlled. Furthermore, refraction index of the nano particles can be 2~3, and transparency thereof is larger than 95%.

Figure 4:
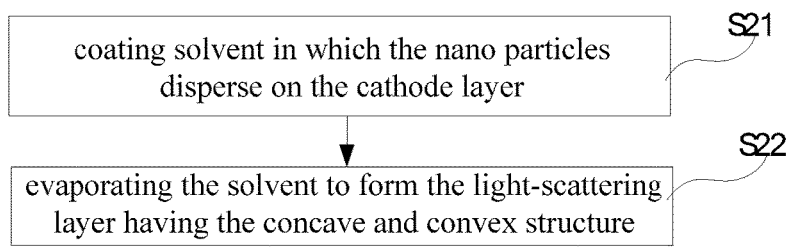
FIG. 4 is a flow chart of a step S2 shown in FIG. 3 in accordance with an embodiment.

One of Ink-jet printing (IJP), spin coating, and scraping coating can be selected to deposit the nano particles on the cathode layer. Referring FIG. 4, taking spin coating for example, the step S2 further includes substeps below:

S21, coating solvent in which the nano particles disperse on the cathode layer. In an embodiment of the present invention, taking ZnO particle of which refraction index is 2 and having high transparency for example, ZnO particles of which diameter are 200 nm are dispersed in the solvent. The solvent can be toluene or other solvent. It is not limited.

The solvent in which the nano particles disperse is coated on the cathode layer by spin coating. The spin coating includes three steps of applying material, high speed spin, and evaporation. It can control thickness of the film by controlling time of spreading glue, rotating speed, drop amount, and concentration and viscosity of solution.

The spin coating of the present invention is an example. It can adopt IJP or scraping coating in other embodiments. The present invention does not specifically introduce the process.

S22, evaporating the solvent to form the light-scattering layer having the concave and convex structure.

The solvent in which the nano particles disperse is coated on the cathode layer and deposited thereon to form an uneven scattering interface. In this embodiment, the nano particles are prepared on the cathode layer. That is, the light-scattering layer does not include matrix material. It is different from the conventional art that the scattering particles as extrinsic material are dispersed in the matrix such as photoresist.

S3, performing package to form the TEOLED.

It performs package to form the TEOLED having the light-scattering layer.

In the embodiment above, the nano particles of high refraction index are prepared on the cathode layer to form the scattering layer. It can effectively improve cathode transmittance of the TEOLED and modulate the coupling output of lights with multiple wavelengths.

In summary, a person skilled in the art can easily understand that the present invention provides a TEOLED and a manufacturing method thereof. The nano particles of high refraction index are prepared on the cathode layer to form the scattering layer. It can effectively improve cathode transmittance of the TEOLED and modulate the coupling output of lights with multiple wavelengths.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A Top-Emitting Organic Light Emitting Diode (TEOLED), comprising:
    a substrate;
    a stack structure on the substrate, comprising an anode layer, a hole-injecting layer, a hole-transmitting layer, an organic light-emitting layer, and an electron-transmitting layer deposited on the substrate in order;
    a cathode layer, covering the stack structure; and
    a light-scattering layer deposited on the cathode layer, composed of nano particles and comprising a concave and convex structure, wherein material of the nano particles is selected from a group consisting of ZnO, $TiO_2$, and $SnO_2$, and wherein the nano particles are dispersed in a solvent coated on the cathode layer, and the solvent is evaporated such that the light-scattering layer with the concave and convex structure is formed.

2. The TEOLED of claim 1, wherein diameter of the nano particles is 50 nm~100 nm.

3. The TEOLED of claim 1, wherein diameter of the nano particles comprises at least a dimension.

4. The TEOLED of claim 1, wherein refraction index of the nano particles is 2~3.

5. The TEOLED of claim 1, wherein transparency of the nano particles is larger than 95%.

6. A Top-Emitting Organic Light Emitting Diode (TEOLED), comprising:
   a substrate;
   a stack structure on the substrate;
   a cathode layer, covering the stack structure; and
   a light-scattering layer deposited on the cathode layer, composed of nano particles and comprising a concave and convex structure, wherein the nano particles are dispersed in a solvent coated on the cathode layer, and the solvent is evaporated such that the light-scattering layer with the concave and convex structure is formed.

7. The TEOLED of claim 6, wherein material of the nano particles is selected from a group consisting of ZnO, $TiO_2$, and $SnO_2$.

8. The TEOLED of claim 7, wherein diameter of the nano particles is 50 nm~100 nm.

9. The TEOLED of claim 7, wherein diameter of the nano particles comprises at least a dimension.

10. The TEOLED of claim 7, wherein refraction index of the nano particles is 2~3.

11. The TEOLED of claim 7, wherein transparency of the nano particles is larger than 95%.

12. The TEOLED of claim 6, wherein the stack structure comprises an anode layer, a hole-injecting layer, a hole-transmitting layer, an organic light-emitting layer, and an electron-transmitting layer deposited on the substrate in order.

13. A method of manufacturing a Top-Emitting Organic Light Emitting Diode (TEOLED), comprising steps of:
    forming a stack structure and a cathode layer on a substrate in order;
    preparing nano particles on the cathode layer to form a light-scattering layer comprising a concave and convex structure; and
    performing package to form the TEOLED;
    wherein preparing nano particles on the cathode layer comprises:
    coating a solvent in which the nano particles disperse on the cathode layer; and
    evaporating the solvent to form the light-scattering layer comprising the concave and convex structure.

14. The method of claim 13, wherein coating the solvent in which the nano particles disperse on the cathode layer comprises a method selected from a group consisting of Ink-jet printing (IJP), spin coating, and scraping coating.

* * * * *